United States Patent [19]
Zlebir et al.

[11] Patent Number: 5,627,398
[45] Date of Patent: May 6, 1997

[54] HALL-EFFECT SENSOR INCORPORATED IN A CMOS INTEGRATED CIRCUIT

[75] Inventors: Silvo Zlebir, Cerklje; Andrej Belič, Kranj, both of Slovenia

[73] Assignee: Iskra Stevci—Industrija Merilne in Upravljalne Tehnike Kranj, D.O.O., Kranj, Slovenia

[21] Appl. No.: 190,768

[22] Filed: Feb. 2, 1994

Related U.S. Application Data

[63] Continuation of Ser. No. 851,527, Mar. 16, 1992.

[30] Foreign Application Priority Data

Mar. 18, 1991 [SI] Slovenia ................... P-476/91

[51] Int. Cl.[6] ................... H01L 29/82; H01L 43/00
[52] U.S. Cl. ................... 257/427; 257/421; 324/207.2; 324/117 H
[58] Field of Search ................... 357/27; 257/421, 257/422, 423, 424, 425, 426, 427; 365/170; 324/207.2, 117 H

[56] References Cited

U.S. PATENT DOCUMENTS 4,660,065  4/1987  Carvajal et al. .
4,742,296  5/1988  Petr et al. ................... 324/142
4,908,527  3/1990  Van Antwerp ................... 357/27
4,929,993  5/1990  Popovic ................... 257/424

FOREIGN PATENT DOCUMENTS 59-228760  12/1984  Japan ................... 259/427

OTHER PUBLICATIONS

"Improved Hall Devices Find New Uses," 8032 Electronics Week, Apr. 29, 1985, vol. 58, No. 17, New York, pp. 59–61.
"Improved Hall Devices Find New Uses", Electronics Week, Apr. 29, 1985, pp. 59–61.

Primary Examiner—Jerome Jackson, Jr.
Assistant Examiner—John Guay
Attorney, Agent, or Firm—Keck, Mahin & Cate

[57] ABSTRACT

The Hall-effect sensor HS' of the invention incorporated in a CMOS integrated circuit IC' is formed with a well 2' as the sensor active layer on a substrate 1'. Heavily doped regions 31', . . . , 34', in the well 2' are connected with sensor metal contacts 41', . . . , 44'. The upper plane S' of the substrate 1' is covered by a field oxide layer 5' the thickness thereof being between 0.8 μm. and 1.0 μm. Over the layer 5' in the region 50' surrounding the sensor contacts 41', . . . , 44', a polysilicon layer 6' is provided to block the disturbing influence of ions migrating in the field oxide layer 5'.

1 Claim, 3 Drawing Sheets

HALL-EFFECT SENSOR INCORPORATED IN A CMOS INTEGRATED CIRCUIT

This is a continuation of application Ser. No. 07/851,527, filed Mar. 16, 1992.

BACKGROUND OF THE INVENTION

1. Technical Field

This application relates to semiconductor integrated circuits.

2. Description of the Prior Art

Up to the present time semiconductor Hall-effect sensors have been fabricated predominantly on silicon by the bipolar technology. For that purpose a portion of an epitaxially grown layer, e.g. of the n-type, is used as the active layer of the Hall-effect sensor. This portion is isolated from other portions of the integrated circuit by a p-isolation wall, which is accomplished by acceptor diffusion into the epitaxial layer, and is disconnected from the p-type substrate by a pn-junction. The metal electrical contacts of the Hall-effect sensor are connected with n-type regions, which are heavily doped and are formed by the diffusion of donor impurities. Therefore the properties of the Hall-effect sensor prevailingly depend on the properties of the epitaxial layer. Normally the donor concentration therein is $10^{16}$, $cm^{-3}$, and the thickness thereof is between 8 μm and 15 μm, depending on the requirements put on other integrated circuit components. Therefore, electric power consumption in such a Hall-effect sensor and in the rest of the integrated circuit fabricated using bipolar technology is high. Moreover, the electric power consumption and the sensitivity of such a Hall-effect sensor are not reproducible since the thickness of the epitaxial layer is not constant. This represents a serious disadvantage to use as a current input and a multiplier in a monolitic integrated circuit for an electric wattmeter.

In addition to the said Hall effect and to the piezo-Hall effect and piezoresistive effect, the stability of the Hall-effect sensor is influenced above all by surface effects. In the protective field effect $SiO_2$ layer, usually covering an integrated circuit, various impurity ions, e.g. sodium ions, are present. Under the influence of the electric field and due to the thermal movement the ions migrate to the active layer of the Hall-effect sensor and they induce therein an electric charge, thus influencing the dependence of the resistivity ρ on the depth t as measured with respect to the surface of the active layer of the Hall-effect sensor and, therefore, also the sensor sensitivity. In the U.S. Pat. No. 4,660,065 a Hall-effect sensor is described which is fabricated using bipolar technology and in which, before the formation of the protective oxide layer, a p-type layer has been implanted. Thus a direct contact of the sensor active layer to the layer of the protective oxide on the surface has been prevented. For the fabrication of the protective layer (an additional step) in the technological process is needed. Furthermore, the active sensor layer is narrowed, and the Hall-effect sensor, because of (higher resistivity ρ (t) gets highly nonlinear, which makes it unsuitable in a monolithic integrated circuit for an electric wattmeter.

SUMMARY OF THE INVENTION

In accordance with the foregoing background discussion, an object of this invention is to provide a Hall-effect sensor which is incorporated in a CMOS integrated circuit by providing an appropriate layer situated side by side to the field oxide layer, and that covers the part of the Hall-effect sensor surrounding sensor contacts. Moreover, it is possible to block, by appropriately connecting the Hall-effect sensor, the disturbing influence of the ions migrating in this field oxide layer exerted on the sensor active layer.

With the foregoing objects in view, the Hall-effect sensor is incorporated in a CMOS integrated circuit in accordance with the invention.

Advantageously, the protection of the active layer of the Hall-sensor of the invention is accomplished by producing the protective layer in a simple process step within the CMOS technology.

Other objects, advantages and features of the invention will be apparent from the following detailed description of the embodiments thereof, when read in conjunction with the accompanying drawings.

BRIEF DESCRIPTION OF THE DRAWINGS

In the drawings,

FIG. 4 is a graph of the concentration of the electric charge carriers vs. the distance from the upper plane of the substrate in the middle of the Hall-effect sensor as represented in FIG. 2a.

DETAILED DESCRIPTION OF THE PREFERRED EMBODIMENTS

Figure 1:
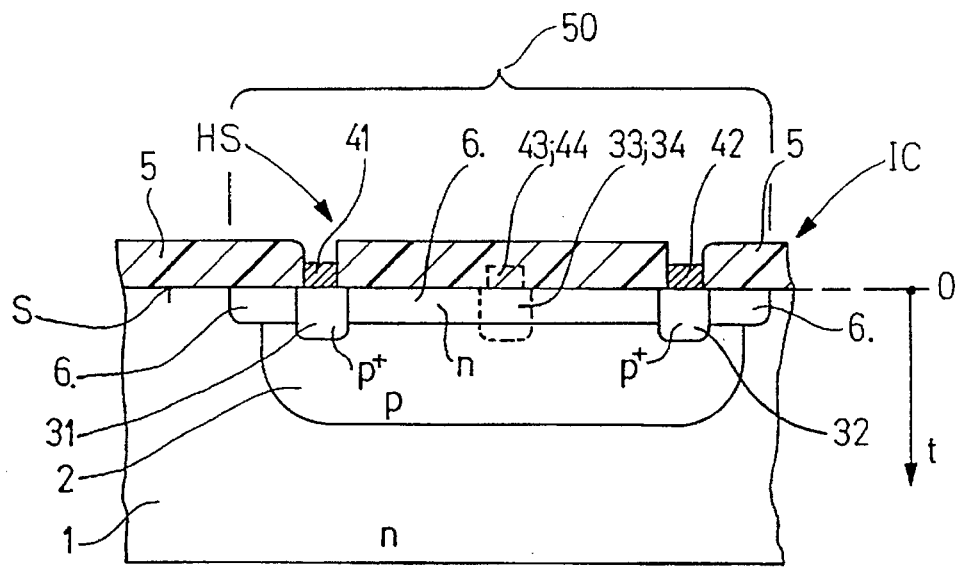
FIG. 1 represents a transversal cross-section of the first embodiment of the Hall-effect sensor in the integrated CMOS circuit according to the invention.

The first embodiment of the Hall-effect sensor HS according to the invention, which is incorporated in the integrated CMOS circuit IC, is illustrated in FIG. 1. On a substrate 1 having a first electrical conductivity type a well 2 of the second electrical conductivity type is formed. Actually, the well 2 is the active region of Hall-effect sensor HS. In the well 2 four separated and heavily doped regions 31, . . . , 34 of the second electrical conductivity type are formed. The axis connecting two regions 31, 32 is perpendicular to the axis connecting two other regions 33, 34. Over the regions 31, . . . , 34 metal electric contacts 41, . . . , 44 of the Hall-effect sensor HS are provided, i.e the supply contacts 41, 42 and the pickup contacts 43, 44. The pickup contacts 43, 44 and the related regions 33, 34 are situated in front of and behind the plane of the drawing, respectively, on the symmetry axis of the axis connecting the supply contacts 41, 42 and for this reason they are represented in FIG. 1 by dotted lines.

The upper plane S of the substrate 1 is covered by a field oxide $SiO_2$ layer 5 everywhere except in the place of the metal contacts 41, . . . , 44 of the Hall-effect sensor HS. The thickness of the field oxide layer 5 is between 0.8 μm and 1.0 μm. Along the field oxide layer 5 which surrounds the metal contacts 41, . . . , 44 of the Hall-effect sensor HS, and depending on the actual embodiment, under the mentioned region of the layer 5 a layer 6 is formed which blocks a disturbing influence of ions migrating in the field oxide layer 5 upon the active layer of the Hall-effect sensor HS.

In the first embodiment of the Hall-effect sensor HS of the invention the n-type layer 6 is formed in the region 50 under the field oxide layer 5 so that it is situated predominantly within the p-type well 2 and that its periphery partly extends into the substrate 1. Since in the first embodiment of the Hall-effect sensor HS the substrate 1 is of n-type as well, the layer 6 and the substrate 1 are electrically connected.

The sheet resistivity of the well 2 functioning as the active layer of the Hall-effect sensor HS is approximately 2 to 4 k$\Omega$/◇. This value of the sheet resistivity is most favourable with regard to the electric power consumption and to the linearity of the Hall-effect sensor HS.

Figure 3:
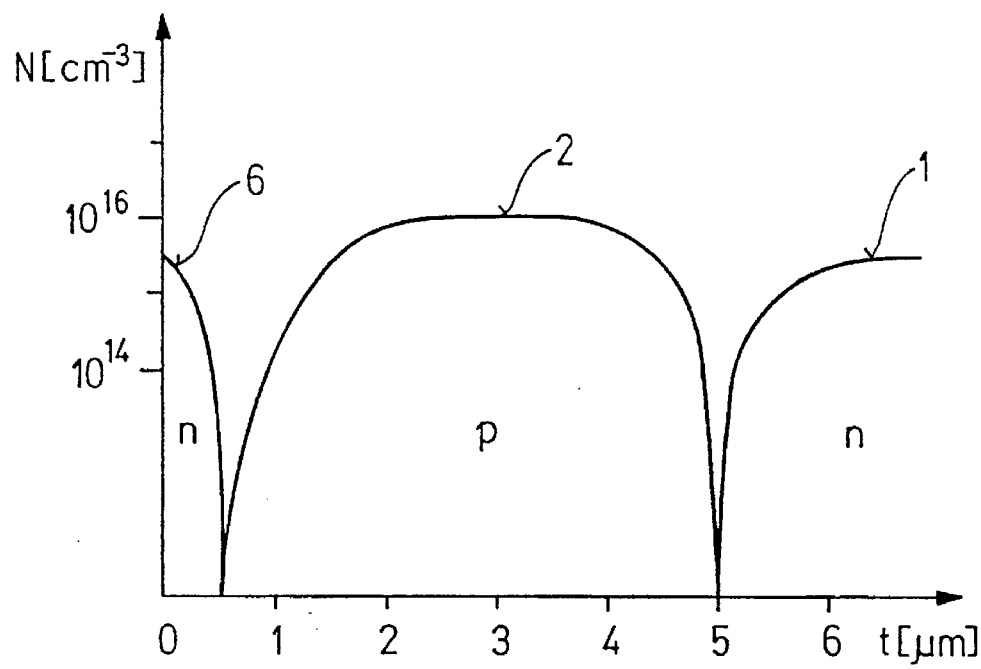
FIG. 3 is a graph of the concentration of the electric charge carriers vs. the distance from the upper plane of the substrate in the middle of the Hall-effect sensor as represented in FIG. 1.

The Hall-effect sensor HS according to the invention is fabricated in a process which is completely compatible with the CMOS technology. On the substrate 1 with the concentration of the dopant of the first electrical conductivity type of the order of $10^{15}$ cm$^{-3}$ to $10^{16}$ cm$^{-3}$ an appropriate dopant of the second electrical conductivity type is implanted and is let to diffuse in order to produce the well 2 of the second electrical conductivity type also having a concentration $10^{15}$ cm$^{-3}$ to $10^{16}$ to cm$^{-3}$. At the depth t of about 3 µm to 6 µm, measured from the upper plane S of the substrate 1 towards its interior, the well 2 is separated from the substrate region by a pn-junction. The graph of the concentration N(cm$^{-3}$) of mobile carriers of electric charge vs the depth t is represented in FIG. 3 for the first embodiments of the Hall-effect sensor HS according to the invention. On the appropriate locations in the well 2 by the implantation of a suitable dopant and by its diffusion to the depth of approximately 1 µm, the heavily doped regions 31, . . . , 34 of the second electrical conductivity type with regions 31, . . . 34 of the second electrical conductivity type with the concentration of mobile carriers of electric charge $10^{22}$ cm$^{-3}$ are formed. Over the regions 31, . . . , 34 the metal electric supply contacts 41, 42 and the metal electric pick-off contacts 43, 44 of the Hall-effect sensor HS are fabricated. Thereafter by the process step, which is common in the integrated circuit fabrication, the surface of the silicon single crystal is thermally oxidized. The thus created field oxide SiO$_2$ layer 5 protects the surface of the integrated circuit IC.

In the fabrication of the first embodiment of the Hall-effect sensor HS, however, the duration of thermal oxidization of the surface of the integrated circuit IC is extended. Thereby in the region 50 just under the field oxide layer 5, a rearrangement of the dopants takes place so that there the n-type layer 6 of several tenths of a micrometer appears. Namely, the field oxide SiO$_2$ absorbs acceptor dopants, e.g. boron, and in the region 50 under the field oxide layer 5 donor dopants, e.g. phosphorus, being originally present in the substrate 1 become prevailing. The complete graph of the concentration of mobile electric charge carriers vs the depth t for the first embodiment of the Hall-effect sensor HS is shown in FIG. 3.

In the following the protecting function of the layer 6 will be described, in which layer the disturbing influence of the migration of the ions in the field oxide layer 5 caused at elevated temperatures and by the electric field is to be blocked. Also the variation of the surface charge at the inner field oxide surface originating from this ion migration exerts a disturbing influence on the active layer of the Hall-effect sensor HS.

In the first embodiment of the Hall-effect sensor HS (FIG. 1) the well 2 is of the p-type and the substrate 1 is on the highest positive potential. The migration of the ions from the field oxide layer 5 towards the active layer of the Hall-effect sensor, i.e. towards the well 2, is prevented by a reverse pn-junction at the border between the n-type layer 6 and the p-type well 2. The linearity of the Hall-effect sensor HS, however, is not impaired since the thickness of the protecting layer 6 is small.

Figure 2A:
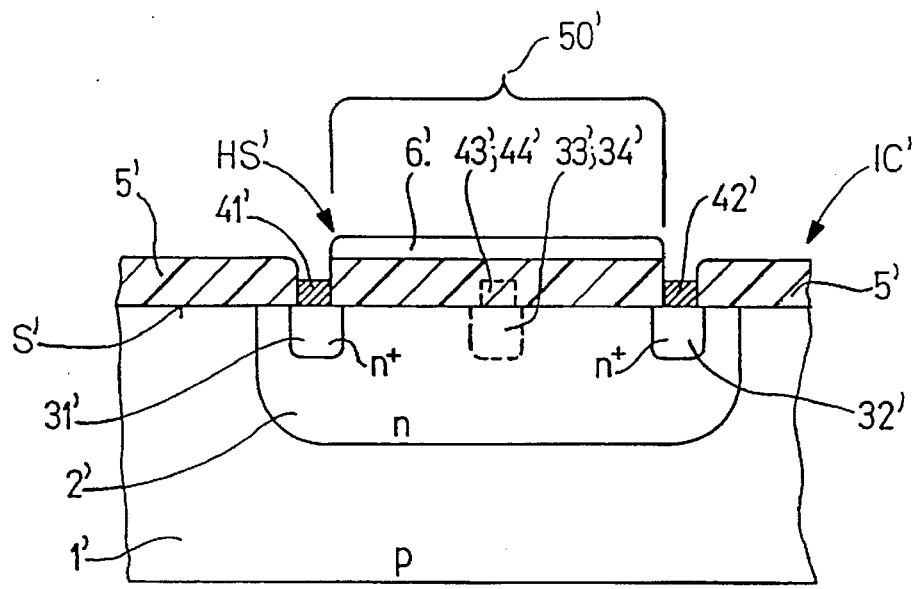
FIG. 2a represents a transversal cross-section of the second embodiment of the Hall-effect sensor in the integrated CMOS circuit according to the invention.

Referring now to FIG. 2, the second embodiment of the Hall-effect sensor HS' according to the invention, which is incorporated in the integrated CMOS circuits IC', is illustrated in FIG. 2a. On a substrate 1' of the first electrical conductivity type a well 2' of the second electrical conductivity type is formed. Actually, the well 2' is the active region of Hall-effect sensor HS'. In the well 2' four separated and heavily doped regions 31', . . . , 34' of the second electrical conductivity type are formed. The axis connecting two regions 31', 32' is perpendicular to the axis connecting two other regions 33', 34'. Over the regions 31', . . . , 34' metal electric contacts 41', 44' of the Hall-effect sensor HS' are provided, i e the supply contacts 41', 42' and the pick-up contacts 43', 44'. The pick-up contacts 43', 44' and the related regions 33', 34' are situated in front of and behind the plane of the drawing, respectively, on the symmetry axis of the axis connecting the supply contacts 41', 42' and for this reason they are represented in FIG. 2a by dotted lines The upper plane S' of the substrate 1' is covered by a field oxide SiO$_2$ layer 5' everywhere except in the place of the metal contacts 41', . . . , 44' of the Hall-effect sensor HS'. The thickness of the field oxide layer 5' is between 0.8 µm and 1.0 µm. Along the field oxide layer 5' which surrounds the metal contacts 41', . . . , 44' of the Hall-effect sensor HS', and depending on the actual embodiments, over the mentioned region of the layer 5' a layer 6' is formed which blocks a disturbing influence of ions migrating in the field oxide layer 5' upon the active layer of the Hall-effect sensor HS'. .

Figure 2B:
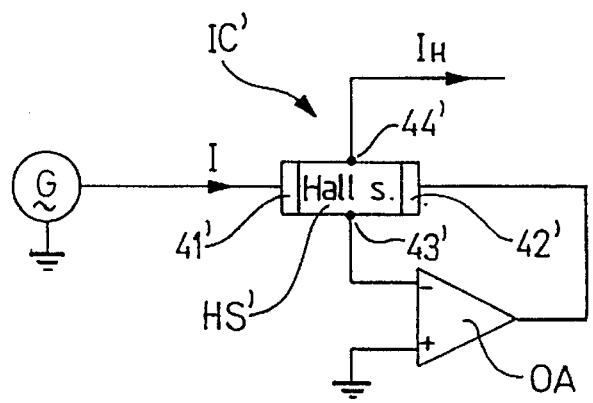
FIG. 2b is a schematic presentation of the connection of the second embodiment of the Hall-effect sensor (FIG. 2a) within the integrated circuit and of its connection to an external current generator.

In the second embodiment of the Hall-effect sensor HS' of the invention the layer 6' is formed of a highly conductive polysilicon and is placed over the field oxide layer 5' in the region 50' which is essentially located between the metal contacts 41', . . . , 44' of the Hall-effect sensor HS'. The layer 6' is connected to the ground of the integrated circuit IC'. The pick-up electric contact 43' (FIG. 2b) of the Hall-effect sensor HS' must he connected to the virtual ground of the supply electric contacts 41', 42' of the Hall-effect sensor HS'. Namely, the polysilicon layer 6' only exerts a blocking action when the supply contact 41' of the Hall-effect sensor HS' is connected to an external current generator G of the sine current I (FIG. 2b). The second supply contact 42' of the Hall-effect sensor HS' is connected to the output of an operational amplifier OA, which is also fabricated in the integrated circuit IC'. The non-inverting input of the operational amplifier OA is connected to the ground; its inverting input, however, is connected to the first pick-up contact 43' of the Hall-effect sensor HS'. Thereby the connection of the contact 43' to the virtual ground of the energization in a wattmeter or in an electric meter fabricated with the Hall-effect sensor HS' incorporated in the CMOS integrated circuit IC' is provided. The Hall current I$_H$ originating from the pick-up contact 44' is conducted further into the integrated circuit IC'.

The sheet resistivity of the well 2' functioning as the active layer of the Hall-effect sensor HS' is approximately 2 to 4 k$\Omega$/◇. This value of the sheet resistivity is most favourable with regard to the electric power consumption and to the linearity of the Hall-effect sensor HS'. Since the electron Hall mobility $\mu_n$ is approximately 3 times the hole Hall mobility $\mu_p$, the well 2' as the active layer in the preferred embodiment of the Hall-effect sensor HS' is of the n-type.

Figure 4:
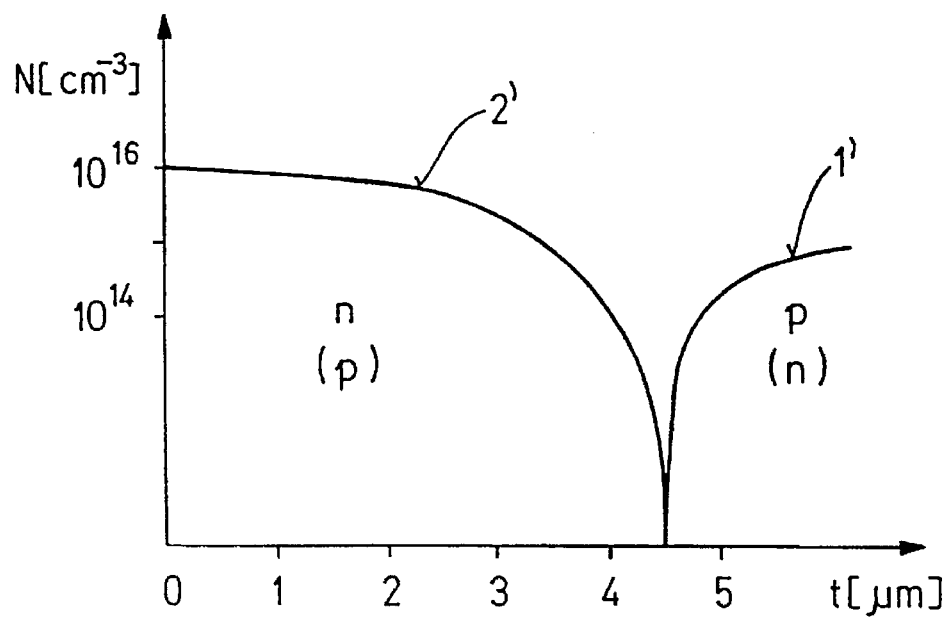

The second embodiment of the Hall-effect sensor HS' according to the invention is fabricated in a process which is completely compatible with the CMOS technology. On the substrate 1' with the concentration of the dopant of the first electrical conductivity type of the order of $10^{15}$ cm$^{-3}$ to $10^{16}$ cm$^{-3}$ an appropriate dopant of the second electrical conductivity type is implanted and it is let to diffuse in order to produce the well 2' of the second electrical conductivity type also having a concentration $10^{15}$ cm$^{-3}$ to $10^{16}$ cm$^{-3}$. At the depth t of about 3 μm to 6 μm, measured from the upper plane S' of the substrate 1' towards its interior, the well 2' is separated from the substrate region by a pn-junction. The graph of the concentration N(cm$^{-3}$) of mobile carriers of electric charge vs the depth t is represented in FIG. 4, for the second embodiment of the Hall-effect sensor HS' according to the invention. On the appropriate locations in the well 2' by the implantation of a suitable dopant and by its diffusion to the depth of approximately 1 μm, the heavily doped regions 31', . . . , 34' of the second electrical conductivity type with the concentration of mobile carriers of electric charge $10^{22}$ cm$^{-3}$ are formed. Over the regions 31', . . . , 34' the metal electric supply contacts 41', 42' and the metal electric pick-off contacts 43', 44' of the Hall-effect sensor HS' are fabricated. Thereafter by the process step, which is common in the integrated circuit fabrication, the surface of the silicon single crystal is thermally oxidized. The thus created field oxide SiO$_2$ layer 5' protects the surface of the integrated circuit IC'.

In the fabrication process of the second embodiment of the Hall-effect sensor HS' only the step of depositing the polysilicon layer 6' on the field oxide layer 5' is still to be added, namely in the region 50' which is situated essentially between the metal contacts 41', . . . , 44' of the Hall-effect sensor HS'.

In the following the protecting function of the layer 6' will he described, in which layer the disturbing influence of the migration of the ions in the field oxide layer 5' caused at elevated temperatures and by the electric field is to be blocked. Also the variation of the surface charge at the inner field oxide surface originating from this ion migration exerts a disturbing influence on the active layer of the Hall-effect sensor HS'.

Figure 5:
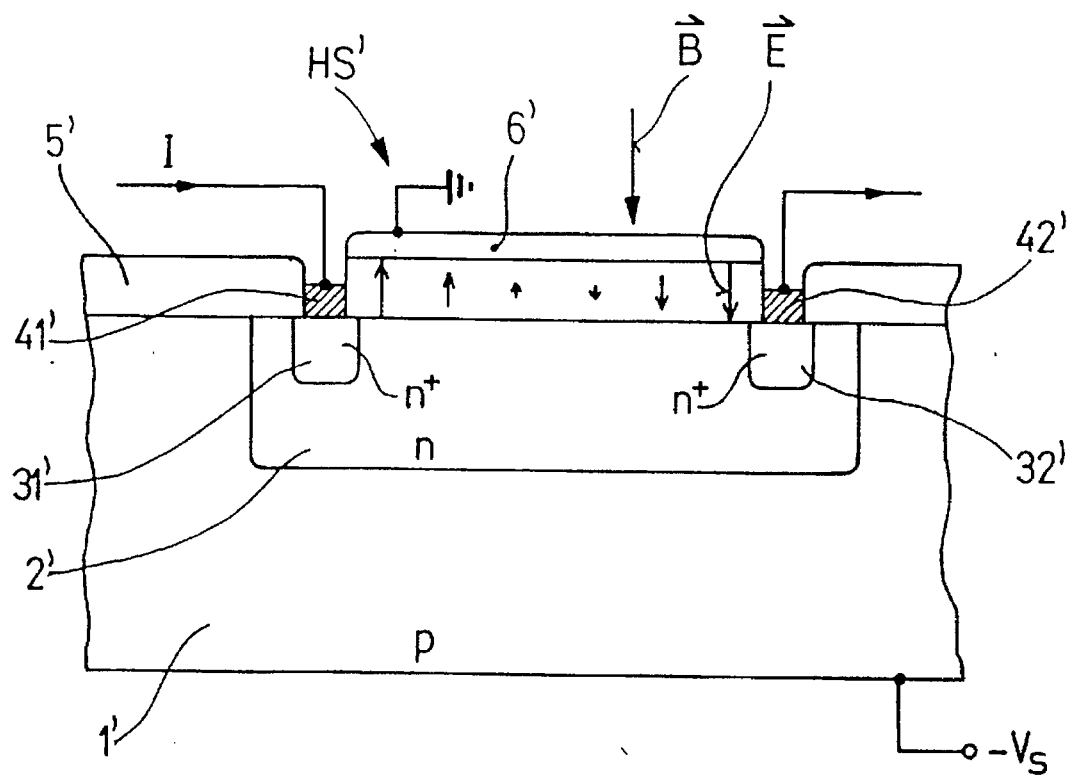
FIG. 5 represents the second embodiment of the Hall-effect sensor in operation.

In the second embodiment of the Hall-effect sensor HS' (FIG. 2a and 2b), unlike the first embodiment (FIG. 1), in order to protect the sensor active layer against disturbances originating from the migration of ions in the field oxide layer 5', besides the actual structure shown in FIG. 2a, there are also required the suplying of the Hall-effect sensor by the sine current generator G and the connection of the sensor pick-up contact 43' to the virtual ground of this supplying circuit (FIG. 2b). The substrate 1' is connected to the potential—$V_s$ and the polysilicon layer 6' is connected to the ground. The magnetic field B is directed perpendicularly to the sensor surface. The electric current I between the regions 31' and 32' and across the sensor active layer, i.e. across the well 2', gives rise to the appearance of the electric field E in the field oxide layer 5' (FIG. 5). Since the sine (with respect to virtual ground) current is supplied to the sensor and since the sensor pick-up contacts 43', 44' are situated on the symmetry axis of the axis connecting the regions 31', 32', the electric field E in the middle between the contacts 41', 42' is equal to 0 and moreover, the time mean value of the electric field E anywhere is also equal to 0. The migration time constant is much longer than the mains i.e., the conductors from which consumer's services are supplied voltage period. Therefore the effects of the migration are mutually cancelled. It should be noted that the layer 6' should not be of metal since at temperature variations it would cause a strain in the silicon within the sensor active layer and thereby inter alia it would influence the sensitivity, the resistance and the offset of the Hall-effect sensor HS'.

What is claimed is:

1. In a combination of a CMOS integrated circuit and a Hall-effect sensor incorporated in the CMOS integrated circuit, a substrate of a first electrical conductivity type, a well of a second electrical conductivity type formed on one surface of said substrate, first and second heavily doped regions in the well and separated from each other on a first axis and having the second electrical conductivity type, third and fourth heavily doped regions in the well and separated from each other on a second axis and having the second electrical conductivity type, said second axis being perpendicular to said first axis, first and second metal electric supply contacts of the Hall-effect sensor over said first and second heavily doped regions, respectively, and first and second metal electric pick-up contacts of the Hall-effect sensor over said third and fourth heavily doped regions, respectively, said first metal electric pick-up contact of the Hall-effect sensor being connected to a virtual ground of the Hall-effect sensor supplying circuit, the improvement comprising:

a field oxide layer having a thickness approximately between 0.8 μm and 1.0 μm on an upper plane of the substrate and overlying said well of the second electrical conductivity type everywhere except in locations over said electric supply contacts and said electric pick-up contacts; and a layer of conductive polysilicon formed over the field oxide layer and connected to a ground of the integrated circuit.

* * * * *